United States Patent [19]
Sebaa

[11] Patent Number: 5,925,144
[45] Date of Patent: Jul. 20, 1999

[54] ERROR CORRECTION CODE CIRCUIT THAT PERFORMS BUILT-IN SELF TEST

[75] Inventor: Lahouari Sebaa, Garden Grove, Calif.

[73] Assignee: Western Digital Corporation, Irvine, Calif.

[21] Appl. No.: 08/816,322

[22] Filed: Mar. 13, 1997

Related U.S. Application Data

[51] Int. Cl.[6] .................................................. G06F 11/27
[52] U.S. Cl. ............................. 714/733; 714/738; 714/30
[58] Field of Search ................... 371/22.4, 22.5, 371/27.1, 22.31; 395/183.06

[56] References Cited

U.S. PATENT DOCUMENTS

| | | | |
|---|---|---|---|
| 3,568,148 | 3/1971 | Clark, Jr. ............................. | 340/146.1 |
| 5,258,985 | 11/1993 | Spence et al. .......................... | 371/22.5 |
| 5,319,599 | 6/1994 | Kato ........................................ | 365/200 |
| 5,359,468 | 10/1994 | Rhodes et al. ............................ | 360/48 |
| 5,515,383 | 5/1996 | Katoozi .................................. | 371/22.4 |
| 5,640,286 | 6/1997 | Acosta et al. .............................. | 360/48 |
| 5,719,884 | 2/1998 | Roth et al. .............................. | 371/37.4 |

*Primary Examiner*—Robert W. Beausoliel, Jr.
*Assistant Examiner*—Scott T. Boderman
*Attorney, Agent, or Firm*—Leo J. Young, Esq.; Milad G. Shara, Esq.

[57] ABSTRACT

An integrated circuit includes an ECC encoder having a normal mode of operation and a test mode of operation. During the test mode, the encoder is operated as a test pattern generator for computing a test pattern that exhaustively stimulates data paths, memory structures and other logic functions on the integrated circuit. A signature of responses to the test pattern can then be computed and compared to a known "correct" signature to determine whether timing faults and other types of faults exist in the integrated circuit. A disk controller chip based on such an integrated circuit can, in addition to testing its own on-chip data paths, memory structures and other logic functions, supply a test pattern to a read/write channel chip and other components on a printed circuit board assembly of a disk drive.

10 Claims, 9 Drawing Sheets

ERROR CORRECTION CODE CIRCUIT THAT PERFORMS BUILT-IN SELF TEST

BACKGROUND OF THE INVENTION

The invention relates generally to fault-detection technology based on error correction code ("ECC") technology employed in correcting errors in data read from a disk of a disk drive. More specifically, it relates to an ECC integrated circuit ("IC") having the capability for built-in self testing.

In each of various processes for mass production of ICs, a substantial number of tests are conducted at various stages of the overall process to weed out defective structures. There are wafer-level tests that weed out whole wafers that appear unlikely to produce good die. There are die-level tests conducted on the die prior to separation from the wafer to weed out die that appear unlikely to produce good ICs. There are "final" tests conducted after the die are packaged to weed out defective ICs.

There are various test architectures relevant here. One such architecture is referred to as "Scan." Another such architecture is referred to as "Built-In Self Test" or "BIST." Another such architecture is referred to as "Scan BIST."

The Scan architecture involves allocating some of the die area of the IC to the testing function, and also providing external test equipment to carry out a test procedure. In an IC that is compatible with the Scan architecture, various registers and switches are added or modified to support the Scan test. When the chip is operated in a test mode, the switches connect the registers and blocks under test into a chain. An externally generated test pattern is supplied to an input of the chain, and a response on an output of the chain is compared to a known "correct" response. If a block in the chain has a "stuck-at fault," the output response will be different from the correct response.

Although Scan is good at detecting "stuck-at" faults, it is not very good at detecting "timing faults" because it cannot be run "at speed." Scan requires an external tester to generate and supply the test pattern to the chip and evaluate the response of the chip. However, the external tester generally runs slower than the clock speed of the chip and, therefore, prevents the test from being run at speed.

Moreover, Scan is costly to implement. With each switch that is added to the chip and with each register that is modified or added, this increases overhead and accordingly the cost of the chip is increased. The cost increase typically results from an increase in die area and an impact on the design schedule. Scan can increase the cost of a chip by 5% to 20%.

The BIST architecture generally involves the construction of a test pattern generator ("TPG") and a test answer evaluator ("TAE") on a chip. The TPG generates test patterns for blocks under test and the TAE evaluates the responses of the blocks to the test patterns. Although good at detecting timing faults, BIST increases cost of the chip by 10% to 20%.

Scan BIST is a combination of Scan and BIST. Switches, registers, a TPG and a TAE are all constructed on a chip. However, the increase in cost is the greatest among the three test architectures, typically between 10% and 25%.

With all three architectures, the cost of a chip is increased disproportionately as the level of circuit integration is increased. Thus, the increased cost can become quite significant in highly integrated, submicron chips.

Cost can be reduced by reducing the fault coverage on a chip. The number of signals in the test pattern for BIST and Scan BIST can be reduced, and the number of registers and switches for Scan and Scan BIST can be reduced. However, the reduction in overhead comes at a price: an increase in the likelihood that a fault will not be detected.

In the disk drive industry, timing faults are especially problematic. Disk drive manufacturers are continually striving to pack more and more circuits into a single integrated circuit disk controller chip. The assignee of this invention has developed a very powerful disk controller chip embodying inventions disclosed and claimed in certain patent applications including application Ser. No. 08/436,521, filed May 8, 1995, titled "DISK DRIVE WITH ERROR CODE EMBEDDED SECTOR IDENTIFICATION," [Docket No. K35A0241], the disclosure of which is hereby incorporated by reference herein; this application is hereinafter referred to as the "Incorporated ECC Disclosure." The Incorporated ECC Disclosure discloses in detail the construction and operation of circuitry and firmware that provides for two types of error detection, one type being performed as a function within an error correction process, and a second type being performed to verify the result of performing an error correction to reduce the risk of a miscorrection. The error correction process involves interleaved codewords in a first Reed-Solomon code. The process of detecting miscorrections involves a codeword in a second Reed-Solomon code. Some systems employ Cyclic Redundancy Codes (CRC) for detecting miscorrections, rather than a Reed-Solomon error detection code.

As this level of integration continues to increase, timing faults will become more prominent on the disk controller chips. Here lies the problem. The disk drive manufacturers cannot afford to mount defective chips to disk controller boards or, worse yet, sell disk drives containing defective disk controller chips and disk controller boards to customers. However, the disk drive manufacturers also cannot afford to increase the cost in order to test for timing faults in the highly integrated, submicron disk drive controllers. At the present level of circuit integration, disk controller chips are not tested completely for timing faults due to the significant cost of BIST and Scan BIST. However, as the level of chip integration is increased, and the chances for a fault occurring in a disk controller chip are also increased, the reduction in fault coverage will become unacceptable.

A need exists for a test that is capable of detecting timing faults in a highly integrated chip without significantly increasing the cost of the chip.

SUMMARY OF THE INVENTION

This invention can be regarded as residing in a circuit that has a normal mode of operation and a built-in self test mode of operation. The circuit comprises first time-shared circuit means for computing a first signal sequence defining redundancy data during the normal mode of operation, and for computing a second signal sequence defining a test pattern during the test mode of operation; and gating means operative during the normal mode to cause the first time-shared circuit means to compute the first signal sequence. The gating means is operative during the test mode of operation to cause the first time-shared circuit means to compute the second signal sequence. The circuit further comprises second time-shared circuit means for performing a data error-detecting function during the normal mode of operation by processing a third signal sequence that, when free from error, includes the first signal sequence, and for performing a circuit verification-test function during the test mode of operation by processing a fourth signal sequence that, in the absence of a fault, has a predetermined relationship with the second signal sequence.

This invention can also be regarded as an integrated circuit that comprises a block under test; an ECC encoder including a plurality of registers; means for converting the encoder into a test pattern generator during a test mode of operation; and first switching means for connecting outputs of at least some of the registers to an input of the block under test during a test mode of operation. The encoder supplies a signal sequence defining a test pattern to the block under test during the test mode. The integrated circuit further comprises ECC decoder means; and second switching means for connecting an output of the block under test to an input of the decoder means during the test mode. The decoder means performs a circuit verification-test function on the block under test during the test mode.

This invention can also be regarded as a printed circuit board assembly for a disk drive. The printed circuit board assembly comprises a host interface; and a disk controller chip having a host bus for receiving data via the host interface. The disk controller chip includes state-defining means for setting a normal mode of operation and a test mode of operation, and switch means controlled by the state-defining means. The chip also includes first time-shared circuit means, responsive to the switch means, for computing a first signal sequence defining redundancy data during the normal mode of operation and a second signal sequence defining a test pattern during the test mode of operation. The switch means propagates the data received via the host bus to the first time-shared circuit means during the normal mode of operation. The first signal sequence is based on the data received via the host bus. The disk controller chip further includes second time-shared circuit means for performing a data error-detecting function during the normal mode of operation by processing a third signal sequence that, when free from error, includes the first signal sequence, and for performing a circuit verification-test function during the test mode of operation by processing a fourth signal sequence that, in the absence of a fault, has a predetermined relationship with the second signal sequence; and programmable switch means for propagating the third signal sequence to the second time-shared circuit means during the normal mode of operation and for propagating the fourth signal sequence to the second time-shared circuit means during the test mode of operation.

This invention can also be regarded as a a method that uses an encoder and decoder of an error correction code circuit to test for faults in a block under test. The encoder includes a feedback shift register having a plurality of registers. The method comprises the steps of running the feedback shift register of the encoder in a closed form; directing outputs of at least some of the registers to an input of the block under test, whereby a sequence of test signals defining a test pattern is supplied to the input of the block under test; directing an output of the block under test to an input of the decoder; and analyzing an output of the decoder to determine whether the block under test has any faults.

DETAILED DESCRIPTION OF THE INVENTION

Figure 1:
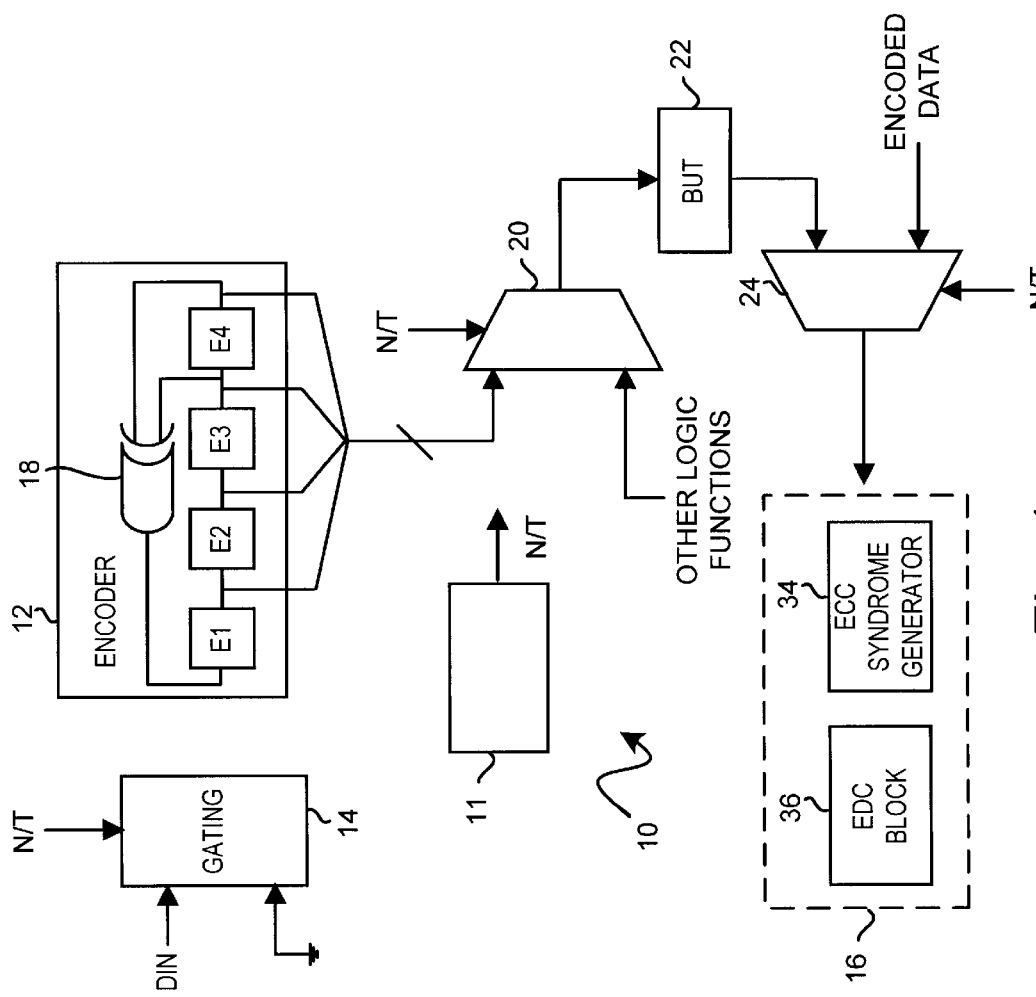
FIG. 1 is a general block diagram of a circuit having a normal mode of operation and a built-in self test mode of operation in accordance with this invention.

With reference to FIG. 1, a circuit generally indicated at 10 has a normal mode of operation and a built-in self test mode of operation. Circuit 10 includes a state-defining means 11 such as a latch, flip-flop, or similar structure for producing a selection signal "N/T" having different values for distinguishing between the normal mode and the test mode. Preferably, circuit 10 is a single integrated circuit and includes an input for receiving an externally generated signal for setting and resetting means 11. Circuit 10 includes an encoder 12 having a linear feedback shift register ("LFSR") with a plurality of feedback taps satisfying a typical primitive generator polynomial. During the normal mode of operation, encoder 12 computes a signal sequence that defines redundancy data. Input data $D_{in}$ are shifted into encoder 12 and the redundancy data are shifted out of encoder 12. The redundancy data are appended to the input data $D_{in}$, thus forming a codeword in accordance with a particular code, preferably a Reed-Solomon code. Encoder 12 suitably has the structure of the type of encoder used in a host interface and disk controller integrated circuit which receives user data from a host and responds thereto to generate redundancy data in the form of error correction code check bytes. Such a disk controller is disclosed in the above-identified Incorporated ECC Disclosure.

Circuit 10 also includes a gating structure 14 that is controlled by the N/T signal to be operative during the normal mode to cause encoder 12 to receive the input data needed to compute the signal sequence defining the redundancy data. Gating structure 14 has a first input adapted to receive the input data $D_{in}$ and a second input tied to ground. An output of gating structure 14 is coupled to an input of encoder 12. Under control of the N/T signal, gating structure 14 propagates the incoming data $D_{in}$ to encoder 12 for encoding during the normal mode of operation. Gating structure 14 suitably includes a multiplexer having a first input supplied with the incoming data $D_{in}$ and a second input tied to ground.

Under control of the N/T signal, gating structure 14 is operative during the test mode to cause encoder 12 to compute a signal sequence defining a test pattern. During the test mode, gating structure 14 ties the input of encoder 12 to ground to correspond to a constant binary 0. Without the input data $D_{in}$ being a constant 0, the LFSR operates in a closed form, cyclically shifting its contents. Regardless of the first non-zero starting value (the "seed") of the sequence, as long as encoder 12 satisfies the primitive generator polynomial, the LFSR will shift through a maximum-length test pattern of a signal sequence during the test mode. The test pattern is pseudorandom.

For example, encoder 12 shown in FIG. 1 includes an LFSR having four register stages $E_1$–$E_4$ and an XOR gate 18 which implement the primitive generator polynomial $p(x) = 1+x^3+x^4$. Outputs of register stages $E_1$–$E_4$ are combined to form a maximum length test pattern of consecutively generated 4-bit wide ("nibbles") test vectors. The test pattern contains $2^4-1=15$ different nibbles. Upon entry into the test mode, a seed is introduced into the LFSR. This can be accomplished in any of various ways. For example, one register stage can be set to "1" and each other register stage can be reset to "0." Such a seed of (1000) will produce a maximum length test pattern during the test mode as set forth below in Table 1:

TABLE 1

| sequence | $E_1$ | $E_2$ | $E_3$ | $E_4$ |
|---|---|---|---|---|
| 1 (seed) | 1 | 0 | 0 | 0 |
| 2 | 0 | 1 | 0 | 0 |
| 3 | 0 | 0 | 1 | 0 |
| 4 | 1 | 0 | 0 | 1 |
| 5 | 1 | 1 | 0 | 0 |
| 6 | 0 | 1 | 1 | 0 |
| 7 | 1 | 0 | 1 | 1 |
| 8 | 0 | 1 | 0 | 1 |
| 9 | 1 | 0 | 1 | 0 |
| 10 | 1 | 1 | 0 | 1 |
| 11 | 1 | 1 | 1 | 0 |
| 12 | 1 | 1 | 1 | 1 |
| 13 | 0 | 1 | 1 | 1 |
| 14 | 0 | 0 | 1 | 1 |
| 15 | 0 | 0 | 0 | 1 |

Circuit 10 also includes a first multiplexer 20, a block under test ("BUT") 22, and a second multiplexer 24. The outputs of register stages $E_1$–$E_4$ are coupled to a first input of first multiplexer 20, and an output of first multiplexer 20 is coupled to an input of block under test BUT 22. Responsive to the N/T signal, first multiplexer 20 supplies the signal sequence of nibbles to BUT 22 when the test mode of operation is selected. Preferably, BUT 22 has all of its data paths and logic functions tested exhaustively by this test pattern of nibbles. Any fault in BUT 22 will be evident from the output responses of BUT 22. The structure of BUT 22 varies with the specific embodiment, and suitably comprises such circuitry as a combinational logic block, a register file, a RAM, a FIFO buffer, etc.

A second input of first multiplexer 20 is adapted to receive a signal sequence that is normally processed by BUT 22. This signal sequence is supplied by other logic circuitry in circuit 10 and propagated by first multiplexer 20 to BUT 22 when the normal mode of operation is selected. For example, in an embodiment in which BUT 22 is a FIFO buffer, BUT 22 is supplied with a signal sequence from a memory or interface logic block during the normal mode of operation.

Circuit 10 also includes a decoder 16 coupled to second multiplexer 24. Second multiplexer 24 has a first input adapted to receive encoded data which, when free from error, include redundancy data generated by encoder 12. In a disk controller, for example, the encoded data are the read data recovered from a disk. Responsive to the N/T signal, second multiplexer 24 propagates the encoded data to decoder 16 during the normal mode of operation. Decoder 16 performs a data error-detecting function during the normal mode by processing the encoded data. Decoder 16 suitably has the structure of the type of decoder used in a host interface and disk controller integrated circuit which receives read data recovered from a disk and responds thereto to generate syndromes in the form of error correction code syndromes bytes. This structure includes an ECC syndrome generator 34 and an EDC block 36. Suitable structure is disclosed in the above-identified Incorporated ECC Disclosure.

A second input of second multiplexer 24 is coupled to an output of BUT 22. During the test mode of operation, the responses of BUT 22 to the signal sequence defining the test pattern are propagated by second multiplexer 24 to decoder 16. Decoder 16 performs a circuit verification-test function during the test mode by processing the responses from BUT 22. The responses, in the absence of a fault in BUT 22, will have a predetermined relationship with the signal sequence defining the test pattern. The structure in decoder 16 provides for compacting the responses to BUT 22 into a generated signature. After the last of the responses from BUT 22 has been processed by the structure in decoder 16, the generated signature is compared to a known "correct" signature. The known signature can be simulated from a response of BUT 22 to the maximum length test pattern. If even one bit in one of the responses is in error, the generated signature will not match the known signature. Thus, a fault in BUT 22 will exist if the two signatures do not match.

Figure 2:
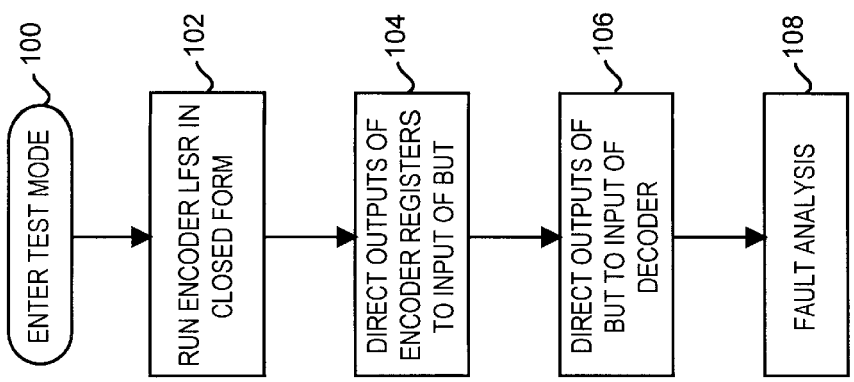
FIG. 2 is a flowchart of a method of performing a built in self test in operation of the circuit of FIG. 1 in accordance with this invention.

With reference to FIG. 2, the steps for testing for faults in BUT 22 involves entry into the test mode (step 100). By this step, the N/T signal is set to a test mode level, whereby gating structure 14 ties the input of encoder 12 to ground, causing the LSFR of encoder 12 to run in a closed form (step 102). Outputs of at least some of register stages $E_1$–$E_4$ of the LFSR are directed, via first multiplexer 20, to an input of BUT 22 (step 104), which generates a response to each of the sequences. An output of BUT 22 is directed, via second multiplexer 24, to an input of decoder 16 (step 106), which analyzes the responses to determine whether BUT 22 has any faults (108). Preferably, the step of analyzing the output is performed by compacting the responses into a signature and comparing the generated signature to a known signature. The value of the generated signature can be affected by the seed. Thus, the generated signature can be compared to each of the possible signatures in order to determine whether a fault exists. Or, the registers of the LFSR can be preset to a known seed, and the generated signature can be compared to the known signature corresponding to the known seed.

Figure 3:
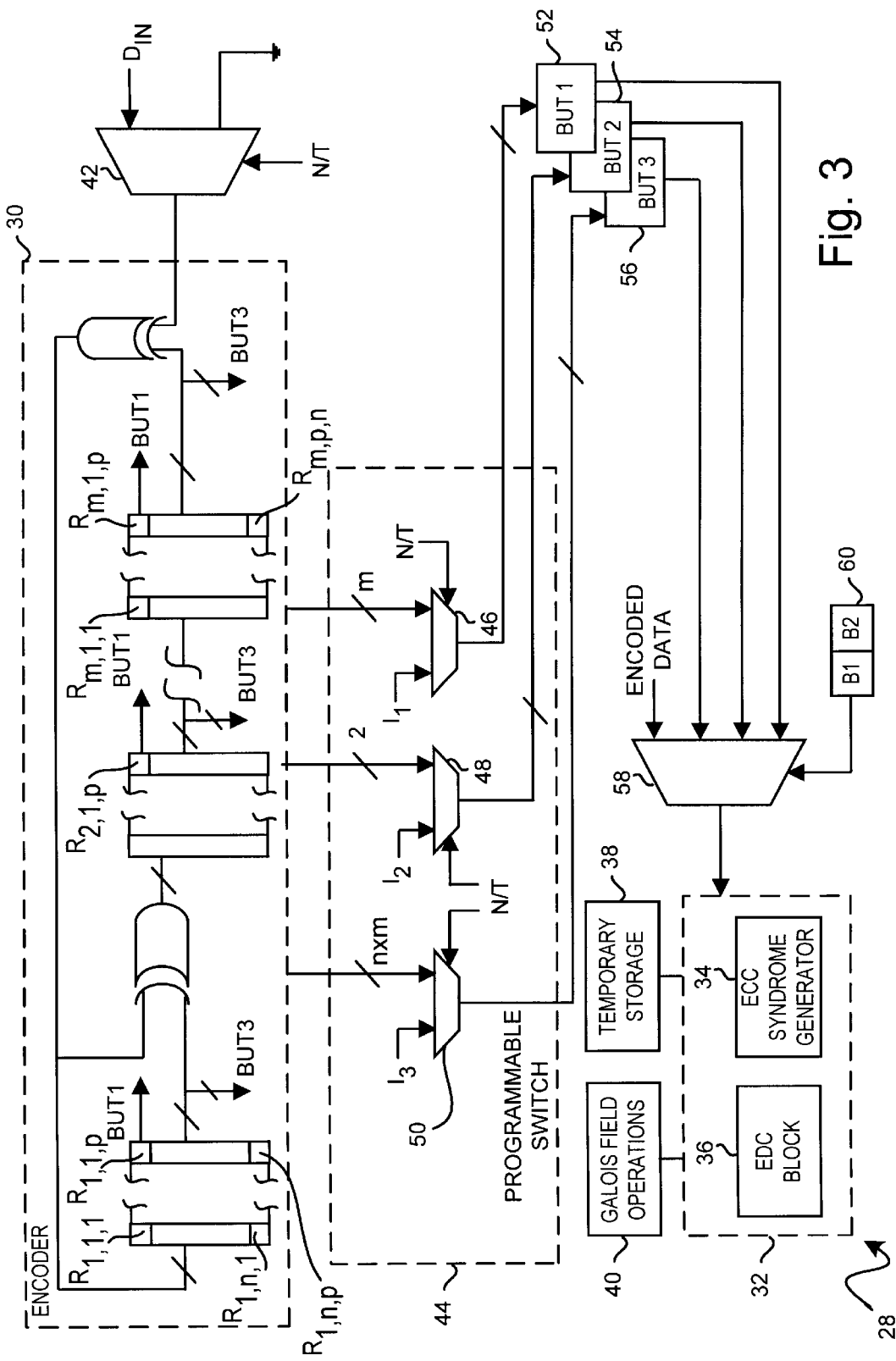
FIG. 3 is a block diagram of an integrated circuit in accordance with this invention.

With reference to FIG. 3, an integrated circuit 28 includes a register 60 that has stages that provide mode control signals corresponding in function to the N/T signal provided by means 11 of circuit 10. Integrated circuit 28 also includes ECC circuitry including an ECC encoder 30 that corresponds in function to encoder 12 of circuit 10. Integrated circuit 28 also includes an ECC decoder 32 that corresponds in function to decoder 16 of circuit 10. Like decoder 16, decoder 32 includes syndrome generator 34 and EDC block 36. Integrated circuit 28 also includes temporary storage 38 for temporarily storing syndromes generated by syndrome generator 34, and a finite field processor 40 for performing Galois Field operations on the syndromes stored in temporary storage 38. Such a finite field processor is disclosed in the above-identified Incorporated ECC Disclosure.

Integrated circuit 28 also includes a switch 42 having a first input for receiving incoming data $D_{in}$ and a second input tied to ground. Switch 42 propagates incoming data $D_{in}$ to an input of encoder 30 during a normal mode of operation, and it ties the input of encoder 30 to ground during a test mode of operation for test pattern generation. Thus, with the addition of a single switch 42 taking up a negligible amount of silicon, integrated circuit 28 is provided with a test pattern generator that can perform at speed testing of data paths and logic functions of integrated circuit 28.

ECC encoder 30 has an n-bit input and includes a plurality of registers ($R_{1,1,1} \ldots R_{m,n,p}$) arranged in m-stages. Each stage has p-way interleaving. An output of each register can provide a test signal, whereby encoder 30 can provide as many as $n \times (2^{m \times p})$ test signals to make up a test pattern. For example, a typical ECC encoder 30 has six stages, with each stage being three-way interleaved, for nine symbol error correction. With each stage being eight bits wide, encoder 30 can generate a maximum length test pattern having a total of $8 \times 2^{18}$ test signals. Thus, any logic function having as many as $8 \times 2^{18}$ inputs can have its internal logic and data paths exhaustively stimulated with the maximum-length test pattern. Next-generation ECC encoders, having twelve stages and three way interleaving for eighteen symbol error correction, will be able to provide a far greater number of test signals.

Outputs of selected encoder registers are coupled to inputs of first, second and third BUTS 52, 54 and 56. For example, an m-bit test pattern for first BUT 52 is provided by the outputs of the $p^{th}$ column of each register stage; a two-bit test pattern for second BUT 54 is provided by registers $R_{l,n,p}$ and $R_{m,n,p}$; and an nxm-bit test pattern for third BUT 56 is provided by all of the registers in the $p^{th}$ column of each stage.

The outputs of the selected registers are coupled to their respective BUTS 52, 54 and 56 by a first programmable switch 44 including first, second and third multiplexers 46, 48 and 50. Each multiplexer 46, 48 and 50 propagates a test pattern to its corresponding BUT 52, 54 or 56 during the test mode of operation, and each multiplexer 46, 48 and 50 propagates the signals normally received by its corresponding BUT 52, 54 or 56 during the normal mode of operation. The number of multiplexers and, therefore, the amount of silicon used by programmable switch 44 increases with the number of blocks under test. Yet with each multiplexer being realized by little more than a pair of FETS, the increase in silicon is negligible in comparison to the amount of silicon utilized by encoder 30 and the blocks under test.

Outputs of BUTS 52, 54 and 56 are coupled to an input of ECC decoder 32 by a second programmable switch 58. Second programmable switch 58 can be a multiplexer having a first input adapted to receive encoded data and three additional outputs adapted to receive the responses from BUTS 52, 54 and 56. Selection of the signal to be sent to ECC decoder 32 is made by register bit B1 and B2 of register 60. A two-bit register could select the signal to be processed in accordance with Table 2 set forth below. The bits B1 and B2 of register 60 can be set externally via pins on the integrated circuit. The amount of silicon used by second programmable switch 58 and register 60 is also negligible.

TABLE 2

| B1 | B2 | Mode |
|---|---|---|
| 0 | 0 | Encoded Data |
| 0 | 1 | BUT1 |
| 1 | 0 | BUT2 |
| 1 | 1 | BUT3 |

During the test mode, the generated signature can be sent out from decoder 32 externally via pins of integrated circuit 28. The generated signature can then be compared to a predetermined signature to determine whether the selected BUT 52, 54 or 56 has any faults.

The syndromes generated by syndrome generator 34 can be based either on a complete composite syndrome or a set of partial syndromes. As used herein, these terms refer to the concatenated bits that correspond to the appended portion of a codeword (either the full string in the case of the composite or the set of symbols that correspond to the roots of the generating polynomial for the code in the case of the partial syndromes). During the normal mode of operation, the syndromes allow the ECC circuit to identify, locate and correct the error, without having the encoded data retransmitted. If the syndrome is not equal to zero or a predetermined value, then integrated circuit 28 performs a set of algorithms to determine the number of errors; find an error location polynomial; find an error location number; determine the actual error location; determine the error value(s); and correct the error. Suitable algorithms are disclosed in the above-identified Incorporated ECC Disclosure.

During the test mode, the syndromes can be used to provide an indication of faults in the selected BUT 52, 54 or 56. If the syndromes are equal to zero or a predetermined value, then the selected BUT 52, 54 or 56 does not have any faults. If the existence of a faults is detected, integrated circuit 28 performs the algorithms, except that error correction is not performed. Instead, the "erroneous" data of the identified location may be sent external to integrated circuit 28 for analysis. The erroneous data can provide information as to the location and value of any faults in the selected BUT 52, 54 or 56. Such analysis would not be used during production testing of integrated circuit 28, but it could assist in debugging integrated circuit 28 during a design phase.

Selection of the algorithms for encoding, decoding and performing the other ECC and EDC functions are based on normal design considerations. In the case of a disk controller chip, correction capability and choice of algorithms are dependent upon considerations such as quality of the media, functional requirements of the media, and bit error rate of the media. Only minor modifications are made to controller design to provide for built-in self testing. By adding first switch 42 and programmable switches 44 and 58, integrated circuit 28 can perform a built-in self test without using up any significant additional amount of silicon.

Figure 4:
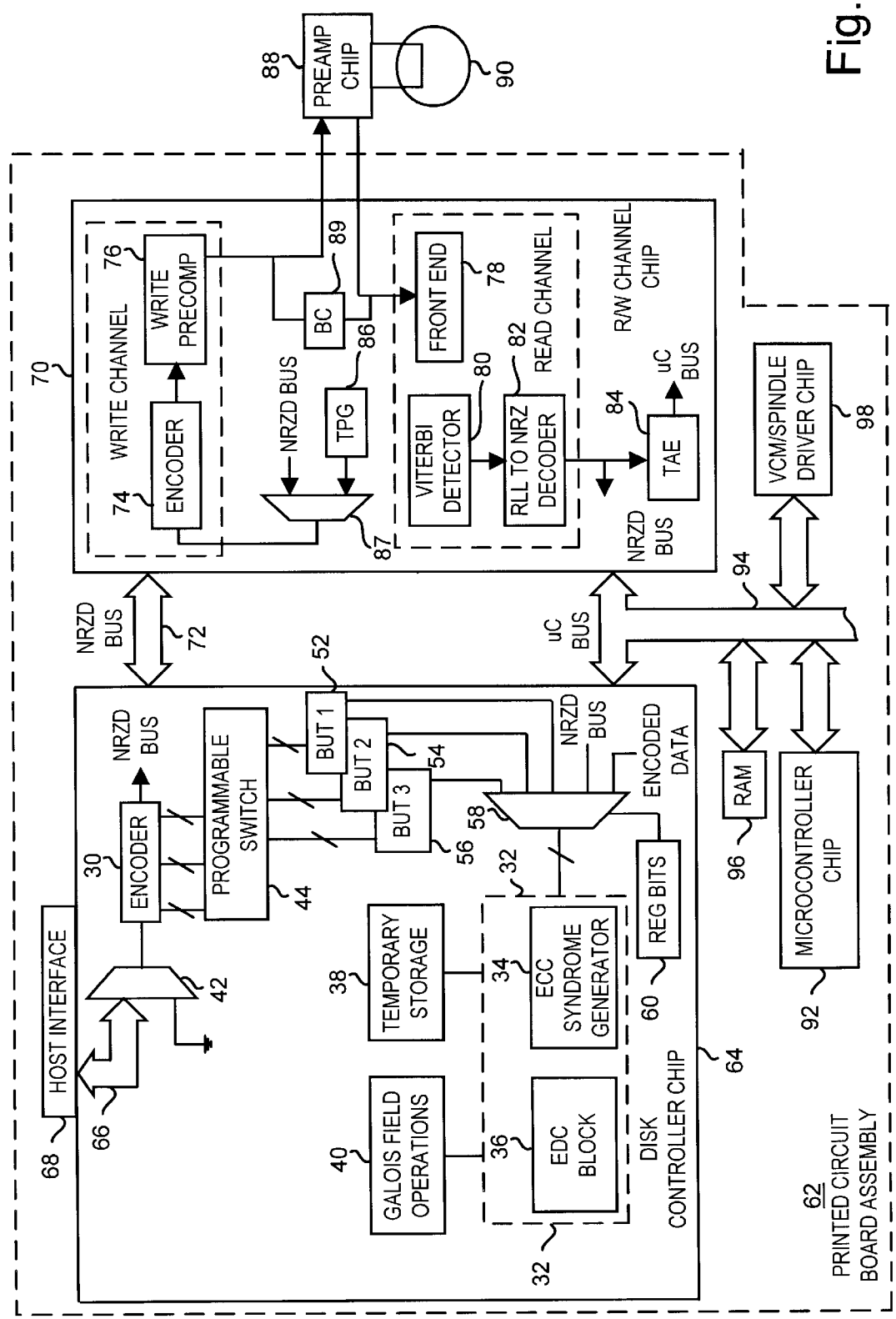
FIG. 4 is a block diagram of a printed circuit board assembly for a disk drive in accordance with this invention.

With reference to FIG. 4, a printed circuit board assembly 62 is adapted for use in a disk drive. Assembly 62 includes a host interface 68 and a disk controller chip 64 having a host bus 66 for receiving data from a host (not shown). Disk controller chip 64 includes an encoder 30, a decoder 32 having a syndrome generator 34, an EDC block 36, a temporary storage block 38 and a Galois Field operations processor 40. Disk controller chip 64 further includes switch 42, first programmable switch 44, first, second and third BUTS 52, 54 and 56, second programmable switch 58, and register 60. The data on host bus 66 are supplied to the first input of switch 42. The selection signal N/T can be applied to switch 42 via a pin or a register bit of disk controller chip 64. The blocks under test 52, 54 and 56 could be data paths, combinational logic blocks, shift registers, RAMs, FIFO buffers, etc. Normal inputs (not shown) to BUTS 52, 54 and 56 are supplied to first programmable switch 44.

The printed circuit board assembly 62 further includes a read/write channel chip 70 that communicates with disk controller chip 64 over a bi-directional channel (NRZD) bus 72. When the disk drive performs a write operation, data received from host bus 66 are encoded by encoder 30, and the resulting encoded data are sent to a write channel of channel chip 70. The write channel, which includes an NRZ-to-RLL encoder 74 and a write precompensation circuit 76, sends RLL-encoded data to a preamplifier chip 88 for storage on a disk 90. When the disk drive performs a read operation, the encoded data on disk 90 are read by preamplifier chip 88 and sent to a read channel of channel chip 70. The read channel includes a front end 78 (e.g., a buffer, an amplifier, a filter and an A/D converter), a Viterbi detector 80 and an RLL-NRZD decoder 82. An output of RLL-NRZD decoder 82 supplies the encoded data to disk controller chip 64 for error detection and correction and subsequent transmission to the host.

A test pattern can be generated on channel chip 70 by a test pattern generator (TPG 86) including a feedback shift register which generates a maximum-length test pattern. TPG 86 supplies a test pattern to one input of a multiplexer 87, and channel bus 72 supplies data to another input of multiplexer 87. A method of using TPG 86 and multiplexer 87 to generate test patterns from channel chip 70 is described below in connection with FIG. 8.

Test answer evaluation can be performed by a test answer evaluator (TAE 84) on the channel chip 70. TAE 84 can include a CRC block having an input adapted to receive the NRZD-encoded data from RLL-to-NRZD decoder 82 and an output coupled to channel bus 72. The RLL-to-NRZD decoder 82 is typically not used for test answer evaluation. The channel chip 70 also includes a bypass circuit 89 which, when turned on, allows data to flow from read channel directly to the write channel. Methods of using TAE 84 and bypass circuit 89 on channel chip 70 are described below in connection with FIGS. 6 and 7.

The assembly 62 includes a microcontroller chip 92, a microcontroller bus 94 for allowing microcontroller chip 92 to communicate with disk controller chip 64 and read/write channel chip 70, RAM 96 utilized by disk controller chip 64 and microcontroller chip 92 for buffering of data, and a VCM/Spindle driver chip 98 for driving a spindle motor (not shown) and a voice coil motor (not shown).

Microcontroller chip 92 includes an interface port for providing external access to fault information provided by decoder 32 of disk controller chip 64 and TAE 84 of channel chip 72. Test modes can be easily controlled and observed through microcontroller interface port.

Microcontroller chip 92 has access to a set of instructions for sequencing disk controller chip 64 and channel chip 70 through the normal and test modes of operation, which instructions include selecting and deselecting signal N/T and setting the bits of register 60. Microcontroller chip 92 also has access to instructions for controlling the storage of data in RAM 96 and the operation of VCM/Spindle driver chip 98. Microcontroller chip 92 includes a control unit which is composed of typically a horizontal or a vertical type microprogrammed ROM, with an instruction ROM, register and decoder.

Microcontroller chip 92 also has access to instructions for programming seeds and generator polynomials into encoder 30 of disk controller chip 64. Programming the various seeds and generator polynomials allows for the generation of multiple sets of test patterns, which could provide higher fault coverage on printed circuit board assembly 62.

The instructions allow microcontroller chip 92 to perform different test modes of operation. Four such test modes are described in FIGS. 5 to 8.

Figure 5:
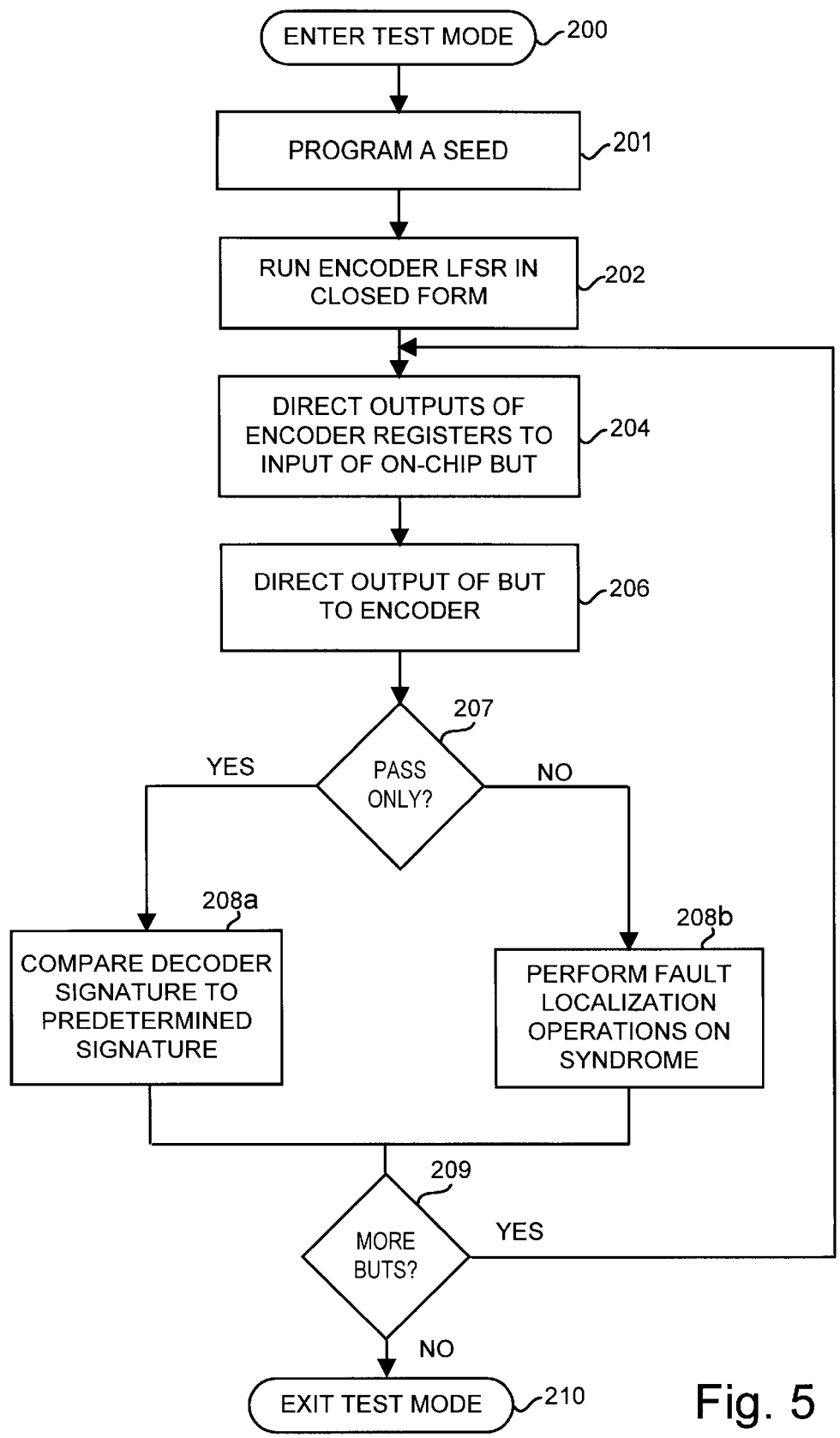
FIG. 5 is a flowchart of a method of testing a disk controller chip in accordance with this invention.

FIG. 5 shows the steps for testing BUTS 52, 54 and 56 on disk controller chip 64. Initiation of the test mode can be performed via microcontroller chip 92 (step 200). For example, microcontroller chip 92 selects selection signal N/T. It could also program a seed into the LFSR of encoder 30 (step 201). The seed could be programmed by applying signals to set/reset inputs of the encoder's registers, or it could be programmed by writing directly to the encoder registers. In response to selection signal N/T, first switch 42 causes the encoder's LSFR to run in a closed form (step 202). Outputs of selected registers are directed, via first programmable switch 44, to inputs of BUTS 52, 54 and 56 (step 204). As many as $n \times (2^{m \times p})$ test signals can be directed to each input of BUTS 52, 5 and 56. The responses of BUTS 52, 54 and 56 are directed to second programmable switch 58, which propagates a selected response to decoder 32 (step 206). Selection is made by register 60, whose bits are set by microcontroller chip 92. If production or reliability testing of printed circuit board assembly 62 is being performed (step 207), microcontroller chip 92 retrieves the generated signature 34 for analysis, or it performs analysis itself (step 208a). The value of the generated signature is affected by the seed. Thus, the generated signature can be compared to each of the possible signatures in order to determine whether a fault exists. If the LFSR can be preset to a known seed, the generated signature can be compared to the known signature corresponding to the known seed. If debugging of printed circuit board assembly 62 is being performed, microcontroller chip 92 outputs the syndromes generated by syndrome generator 34 for fault localization analysis, or it performs the fault localization analysis itself (step 208b).

After one BUT 52, 54 or 56 has been tested for faults, microcontroller chip 92 sets an appropriate bit in register 60 and tests for faults in the next BUT 52, 54 or 56 (step 209). After microcontroller chip 92 has sequenced through all of the BUTS 52, 54 and 56 (step 209), microcontroller chip 92 deselects selection signal N/T, whereby the test mode is exited (step 210).

Figure 6:
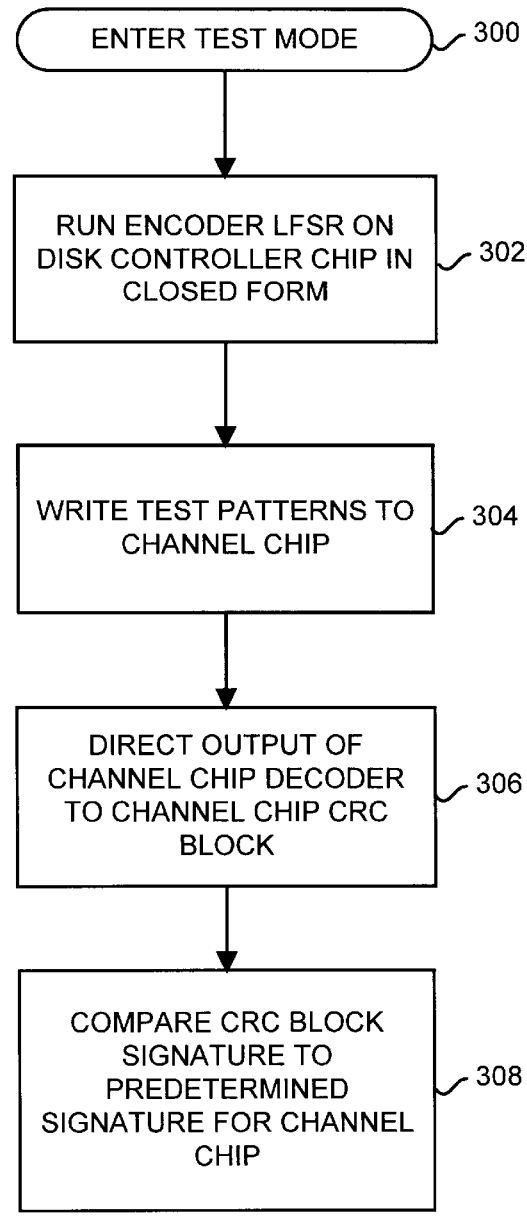
FIG. 6 is a flowchart of a method of testing a read/write channel chip in accordance with this invention.

FIG. 6 shows the steps for testing for faults in channel chip 70. The microcontroller chip 92 initiates the test mode (step 300) and the LFSR of encoder 30 is run in a closed form (step 302). Under control of microcontroller chip 92, encoder 30 writes the test pattern to channel bus 72, and the write channel of channel chip 70 processes the test pattern from channel bus 72 (step 306). Microcontroller chip 92 causes bypass circuit 89 to be closed, whereby an output of the write channel is directed to an input of the read channel, which further processes the test pattern. TAE 84 on channel chip 70 is then enabled by microcontroller 92, and the signature generated by TAE 84 is sent to microcontroller chip 92 via microcontroller bus 94. Comparison of the signature generated by TAE 84 to a known signature indicates whether channel chip 70 has any fault (step 308). This test can be performed quickly, since data flows in only one direction on channel bus 72 and microcontroller bus 94.

Figure 7:
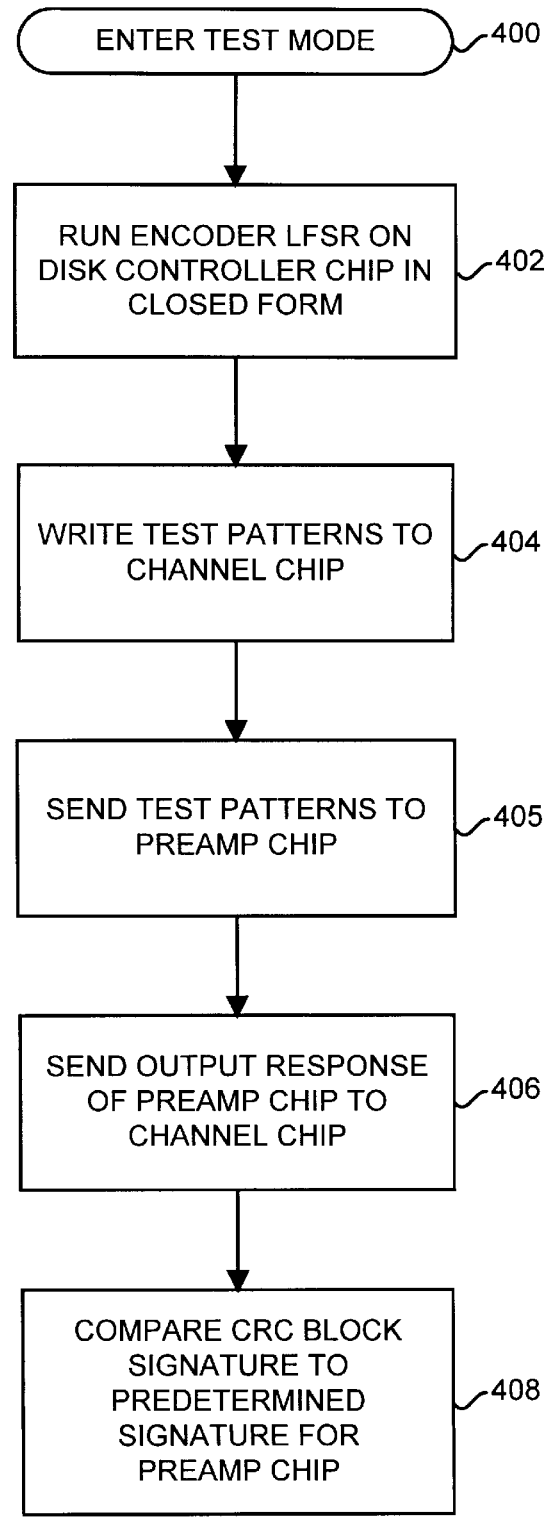
FIG. 7 is a flowchart of a method of testing a preamplifier chip in accordance with this invention.

FIG. 7 shows the steps for testing for faults in preamplifier chip 88. Microcontroller chip 92 initiates the test mode (step 400) and the LFSR of encoder 30 is run in a closed form (step 402). Under control of microcontroller chip 92, a test pattern is written to the write channel of channel chip 70 (step 404), bypass switch 89 is opened, and data from the write channel are sent to preamplifier chip 88 (step 405). A response of preamplifier chip 88 is sent to the read channel of channel chip 70 and evaluated by TAE 84 on channel chip 70. The signature generated by TAE 84 is evaluated to determine whether preamplifier chip 88 has any fault (step 408).

Figure 8:
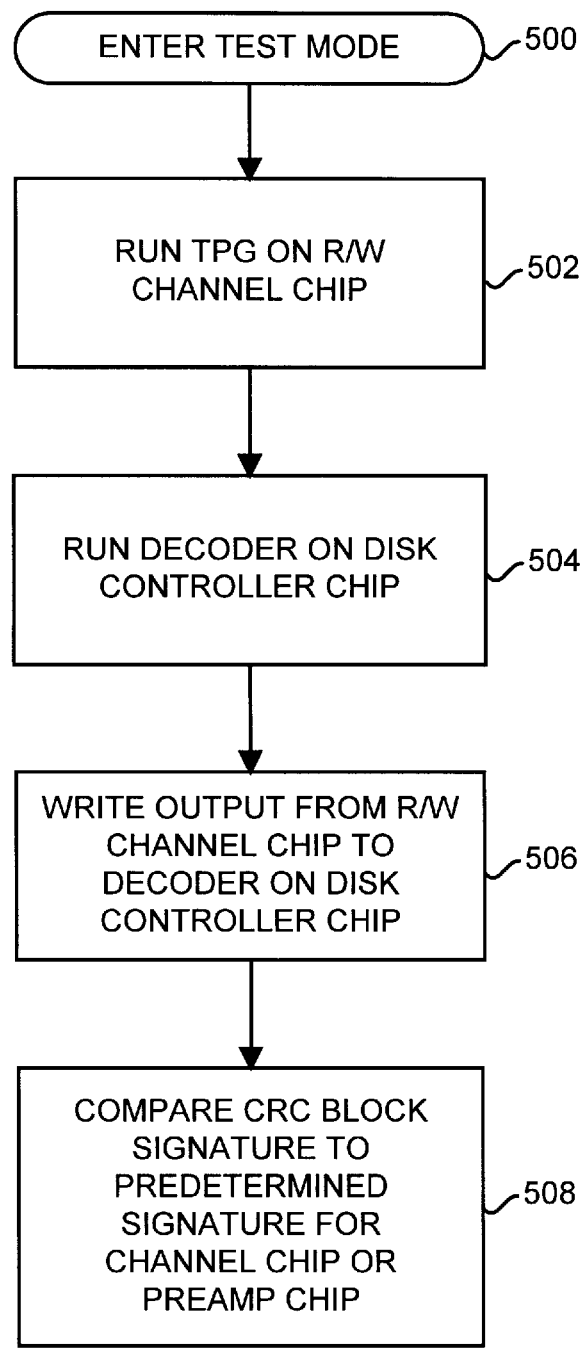
FIG. 8 is a flowchart of an alternative method of testing the read/write channel chip and the preamplifier chip in accordance with this invention.

FIG. 8 shows steps for an alternative method of testing for faults in channel chip 70 and preamplifier chip 88. After entering the test mode (step 500), microcontroller chip 92 enables TPG 86 and commands multiplexer 87 to propagate a test pattern from TPG 86 to RLL encoder 74 of the write channel (step 502). Decoder 32 on disk controller chip 64 is also enabled (step 504). If only the channel chip 70 is to be tested, the bypass switch 89 is closed; otherwise, the bypass switch 89 is opened. An output signal sequence from channel chip 70 is written to channel bus 72 (step 506), and processed by decoder 32 on disk controller chip 64. A signature generated by decoder 32 is analyzed to determine whether channel chip 70 and/or preamplifier chip 88 have any faults (step 508).

Figure 9:
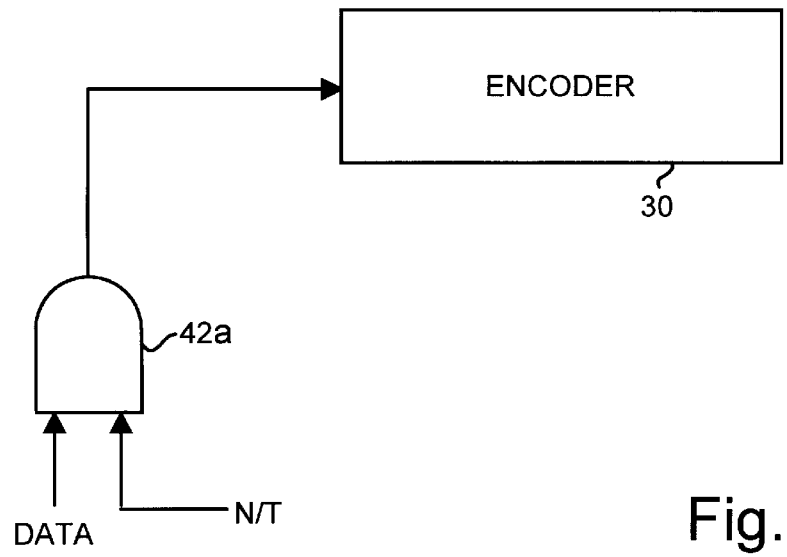
FIG. 9 is a block diagram of an alternative embodiment of a mode-controlled switch and an encoder in accordance with this invention.

FIGS. 9 to 12 show alternative embodiments of this invention. FIG. 9 shows a switch including a simple gate such as an AND gate 42a for propagating a zero-level to encoder 30 during the test mode of operation. The incoming data $D_{in}$ are supplied to one input of AND gate 42a and selection signal N/T is supplied to the other input of AND gate 42a. Other types of gates could be used for converting encoder 30 to a test pattern generator.

Figure 10:
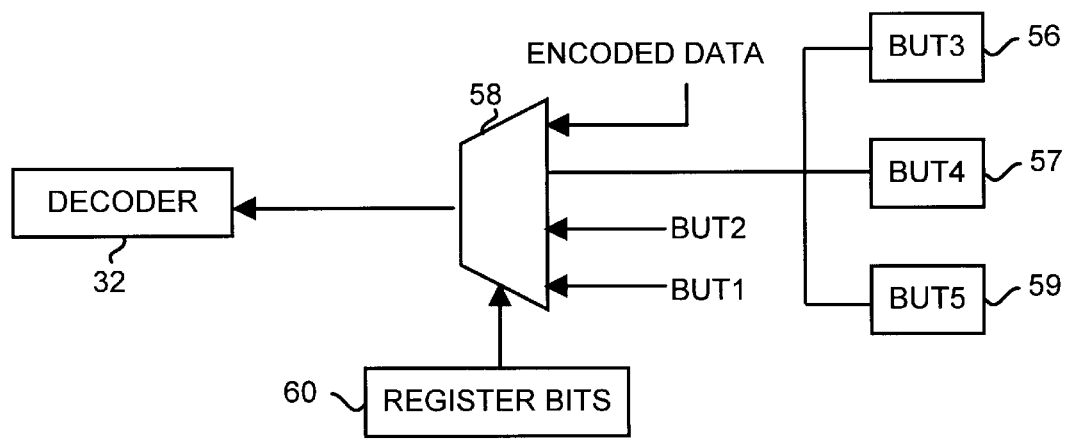
FIG. 10 is a block diagram of an alternative embodiment of a programmable switch and a decoder in according to this invention.

FIG. 10 shows second programmable switch 58 having four inputs with three of the inputs receiving encoded data and responses from the first and second BUTS 52 and 54. The fourth input is provided with a wide enough data path to receive inputs from three additional BUTS 56, 57 and 59. For example, the fourth input might have a six-bit input data path, which receives the two-bit responses of each of the additional BUTS 56, 57 and 59. When the fourth input is selected by register 60, decoder 32 processes the responses from the from three additional BUTS 56, 57 and 59 simultaneously.

Figure 11:
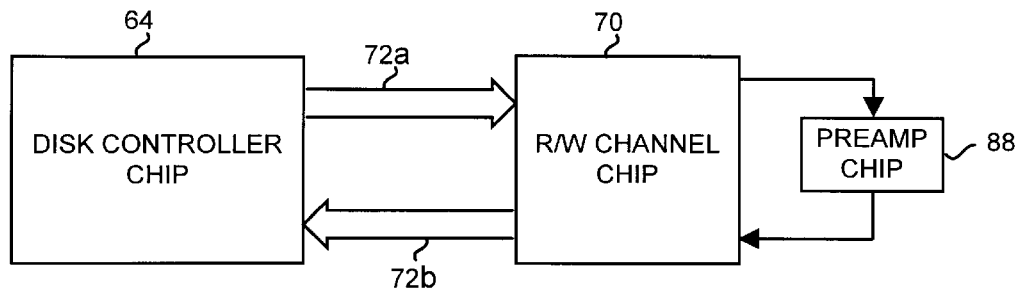
FIG. 11 is a block diagram of an alternative embodiment of a printed circuit board assembly in accordance with this invention.

FIG. 11 shows disk controller chip 64 and read/write channel chip 70 communicating over a channel bus that is split into two unidirectional buses: a first data bus 72a allowing data to be propagated from disk controller chip 64 to channel chip 70, and a second data bus 72b allowing data to be propagated from channel chip 70 to disk controller chip 64. For example, an eight-bit wide channel bus might be split into a four-bit write bus 72a and a four-bit read bus 72b. The split channel bus allows a test pattern to be propagated from encoder 30 of disk controller chip 64 to channel chip 70 at the same time the responses from channel chip 70 are being propagated to decoder 32 of disk controller chip 64. Thus, the split channel bus allows test pattern generation and test answer evaluation to be performed quickly by disk controller chip 64.

Figure 12:
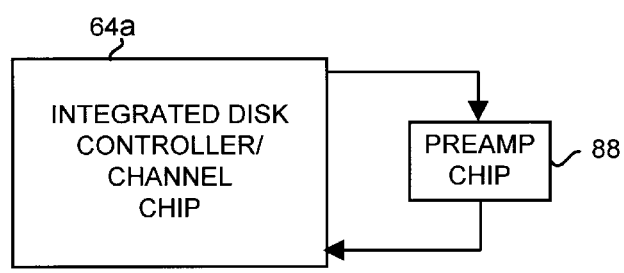
FIG. 12 is a block diagram of another alternative embodiment of a printed circuit board assembly in accordance with this invention.

FIG. 12 shows a disk controller chip 64a and a preamplifier chip 88 connected directly to disk controller chip 64a. Disk controller chip 64a includes the functionality of a read/write channel chip. That is, disk controller chip 64a includes a read channel and a write channel. This integrated disk controller chip 64a tests preamplifier chip 88 by writing a test pattern directly to preamplifier chip 88. The read and write channels and components thereof can be tested as on-chip BUTS of disk controller chip 64a.

The invention is not restricted to an encoder of the type used in communication controllers. Any encoder that is capable of test pattern generation can be used. If the encoder is not based on a primitive polynomial, a maximum length pattern can still be obtained from a subset of the test signals. Thus, a feedback shift register that is n-bit wide, has m-stage and p-way interleaving and that is not based on a primitive polynomial would use less than $n \times 2^{m \times p}$ test signals to generate a maximum length test pattern. Even a non-linear feedback shift register could be used, except that its XOR gates would be replaced by other AND gates to allow for test pattern generation.

Thus disclosed is an invention that is capable of detecting timing faults in a highly integrated, deep submicron chip such as a disk controller chip. When use is made of existing ECC logic to generate test patterns and evaluate test responses, timing faults can be tested completely with only a negligible increase in cost of the chip. The invention is advantageous not only for disk controllers, but for any circuit that already employs error correction logic. Such circuits include communication controllers, and very large scale integrated circuits and application specific integrated circuits that already have on-chip error detection and correction logic to assure proper levels of reliability and data integrity.

Another advantage of the invention is that it reduces test time of an integrated circuit because testing is performed on-chip, at speed and is based only on the reading of a final signature. In addition to testing integrated circuits, the invention can be used advantageously to test board level assemblies, such as printed circuit board assemblies for disk drives. Because vector-based testing is not needed, the invention does not require a significant test development effort, and testing time can be reduced from several weeks to little more than a couple of hours.

Yet another advantage of the invention is that it provides greater fault coverage than conventional tests. By programming different seeds into the encoder, different test patterns can be used to stimulate logic functions and data paths, whereby different test patterns might catch faults that were previously undetected.

I claim:

1. A circuit having a normal mode of operation and a built-in self test mode of operation, the circuit comprising:

a first chip and a second chip;

first time-shared circuit means disposed on the first chip for computing a first signal sequence defining redundancy data during the normal mode of operation, and for computing a second signal sequence defining a test pattern during the test mode of operation;

gating means operative during the normal mode to cause the first time-shared circuit means to compute the first signal sequence;

the gating means being operative during the test mode of operation to cause the first time-shared circuit means to compute the second signal sequence; and second time-shared circuit means disposed on the second chip for performing a data error-detecting function during the normal mode of operation by processing a third signal sequence that, when free from error, includes the first signal sequence, and for performing a circuit verification-test function during the test mode of operation by processing a fourth signal sequence that, in the absence of a fault, has a predetermined relationship with the second signal sequence.

2. The circuit of claim 1 wherein the first chip is a disk controller chip and the second chip is a read/write channel chip.

3. An integrated circuit comprising:

a block under test;

an ECC encoder comprising:
  an n-bit input;
  a plurality of registers organized into m-stages;
  each stage having p-way interleaving, wherein m, n, and p are positive integers;

means for converting the encoder into a test pattern generator for generating a plurality of test patterns during a test mode of operation wherein the encoder provides as many as $n \times (2^{m \times p})$ test signals that can make up the test patterns;

first switching means for connecting outputs of at least some of the registers to an input of the block under test during a test mode of operation, whereby the encoder supplies a signal sequence defining a test pattern to the block under test during the test mode;

ECC decoder means; and second switching means for connecting an output of the block under test to an input of the decoder means during the test mode, whereby the decoder means performs a circuit verification-test function on the block under test.

4. The circuit of claim 3, wherein the converting means includes a switch having a first input adapted to receive incoming data and a second input adapted to receive a zero level, an output of the switch providing the incoming data to the encoder during a normal mode of operation, the output of the switch providing a stream of zeros to keep the encoder in a feedback mode for test pattern generation during the test mode of operation.

5. A printed circuit board assembly for a disk drive, the assembly comprising:

a host interface;

a disk controller chip having a host bus for receiving data via the host interface, the disk controller chip including:

state-defining means for setting a normal mode of operation and a test mode of operation;

switch means controlled by the state-defining means;

first time-shared circuit means, responsive to the switch means, for computing a first signal sequence defining redundancy data during the normal mode of operation and a second signal sequence defining a test pattern during the test mode of operation;

the switch means propagating the data received via the host bus to the first time-shared circuit means during the normal mode of operation, the first signal sequence being based on the data received via the host bus;

second time-shared circuit means for performing a data error-detecting function during the normal mode of operation by processing a third signal sequence that, when free from error, includes the first signal sequence, and for performing a circuit verification-test function during the test mode of operation by processing a fourth signal sequence that, in the absence of a fault, has a predetermined relationship with the second signal sequence;

programmable switch means for propagating the third signal sequence to the second time-shared circuit means during the normal mode of operation and for propagating the fourth signal sequence to the second time-shared circuit means during the test mode of operation; and a preamplifier chip electrically connected to the disk controller chip, the second signal sequence being selectively sent to the preamplifier chip during the test mode of operation, the second time-shared circuit means performing the circuit verification-test function on responses of the preamplifier chip to the second signal sequence.

6. A method of using an encoder and decoder of an error correction code circuit to test for faults in a block under test, the encoder including a feedback shift register having a plurality of registers, the plurality of registers being arranged in m-register stages, with each register stage having an n-bit input and p-way interleaving, where m, n and p are positive integers, the method comprising the steps of:

running the feedback shift register of the encoder in a closed form;

directing outputs of at least some of the registers to direct as many as $n \times (2^{m \times p})$ test signals to an input of the block under test, whereby a sequence of test signals defining a test pattern is supplied to the input of the block under test;

directing an output of the block under test to an input of the decoder; and analyzing an output of the decoder to determine whether the block under test has any faults.

7. The method of claim 6, wherein the encoder is on a disk controller chip and a test answer evaluator and the block under test are on a read/write channel chip, wherein the step of directing the outputs of at least some of the registers includes the step of writing the sequence of test signals to the read/write channel chip, and wherein the step of directing outputs of the block under test includes the step of directing an output of the channel chip to the test answer evaluator.

8. The method of claim 6, wherein the encoder is on a disk controller chip and a test answer evaluator is on a read/write channel chip, wherein the block under test is a preamplifier chip electrically connected to the read/write channel chip, and wherein the step of directing the outputs of at least some of the registers includes the step of sending the sequence of test signals to the preamplifier chip via the read/write channel chip, whereby an output response of the preamplifier chip is directed to the test answer evaluator on the read/write channel chip.

9. An integrated circuit comprising:

an encoder including a feedback shift register having a plurality of individual registers arranged in m-register stages, each register stage having an n-bit input and p-way interleaving, where m, n and p are positive integers, the encoder having a normal mode of operation and a test mode of operation; and mode-controlled means for propagating incoming data to the encoder for encoding during the normal mode of operation, the mode-controlled means causing the feedback shift register to operate in a closed form during the test mode of operation;

outputs of as many as $n \times (2^{m \times p})$ of the individual registers providing test signal sequences defining a test pattern during the test mode of operation.

10. The integrated circuit of claim 9, further comprising a plurality of blocks under test; and first programmable switching means for connecting the outputs of at least some of the individual registers to an input of a selected block under test during the test mode.

* * * * *